(12) United States Patent
Jang et al.

(10) Patent No.: US 10,003,299 B2
(45) Date of Patent: Jun. 19, 2018

(54) PHOTOVOLTAIC MODULE

(71) Applicant: LG ELECTRONICS INC., Seoul (KR)

(72) Inventors: Daehee Jang, Changwon-si (KR); Seungyong Lee, Changwon-si (KR); Jaehyuk Park, Changwon-si (KR); Changuk Kim, Changwon-si (KR)

(73) Assignee: LG ELECTRONICS INC., Seoul (KR)

( * ) Notice: Subject to any disclaimer, the term of this patent is extended or adjusted under 35 U.S.C. 154(b) by 51 days.

(21) Appl. No.: 15/160,420

(22) Filed: May 20, 2016

(65) Prior Publication Data

US 2016/0268966 A1    Sep. 15, 2016

Related U.S. Application Data

(63) Continuation of application No. 13/437,357, filed on Apr. 2, 2012, now Pat. No. 9,373,959.

(30) Foreign Application Priority Data

Jun. 21, 2011  (KR) .................. 10-2011-0060144
Jul. 22, 2011  (KR) .................. 10-2011-0073017

(51) Int. Cl.
   *H01L 31/044*    (2014.01)
   *H02S 40/34*     (2014.01)
   (Continued)

(52) U.S. Cl.
   CPC ............. *H02S 40/34* (2014.12); *H02J 3/385* (2013.01); *H02S 30/10* (2014.12); *H02S 40/32* (2014.12);
   (Continued)

(58) Field of Classification Search
   CPC ........ H01L 31/00–31/208; Y02E 10/50–10/60
   (Continued)

(56) References Cited

U.S. PATENT DOCUMENTS 5,951,785 A * 9/1999 Uchihashi .............. F24J 2/5262
                                                          136/246
2001/0009160 A1    7/2001 Otani et al.
   (Continued)

FOREIGN PATENT DOCUMENTS

JP    10-267353 A    3/1997
JP    09-271179 A    10/1997
   (Continued)

*Primary Examiner* — Bach T Dinh
(74) *Attorney, Agent, or Firm* — Dentons US LLP

(57) ABSTRACT

The present invention relates to a photovoltaic module. A photovoltaic module according to an embodiment of the present invention comprises a solar cell module, a micro-inverter to convert DC power generated by the solar cell module into AC power, a controller to control the micro-inverter's operation, and an interface unit connected to power grid supplying external electrical power and to provide the AC power to the power grid, the controller to control operation of the micro-inverter such that the AC power is matched to the external electrical power flowing into the power grid. The photovoltaic module according to the present invention can provide electrical power generated at solar cell modules through a simple connection to power grid which supplies electrical power to home, reducing consumption of electrical power flowing into home.

24 Claims, 18 Drawing Sheets

(51) Int. Cl.
*H02J 3/38* (2006.01)
*H02S 30/10* (2014.01)
*H02S 40/32* (2014.01)
*H02S 40/38* (2014.01)
*H02M 7/48* (2007.01)
*H02M 1/00* (2006.01)

(52) U.S. Cl.
CPC ............ *H02S 40/345* (2014.12); *H02S 40/38* (2014.12); *H02M 7/48* (2013.01); *H02M 2001/007* (2013.01); *Y02B 10/14* (2013.01); *Y02E 10/58* (2013.01)

(58) Field of Classification Search
USPC ................................................ 136/243–265
See application file for complete search history.

(56) References Cited

U.S. PATENT DOCUMENTS

| | | |
|---|---|---|
| 2007/0177338 A1 | 8/2007 | Nishi et al. |
| 2007/0221267 A1 | 9/2007 | Fornage |
| 2010/0007212 A1 | 1/2010 | Zanarini et al. |
| 2011/0084556 A1 | 4/2011 | Marroquin et al. |
| 2012/0255596 A1 | 10/2012 | Korman et al. |
| 2012/0318318 A1 | 12/2012 | Metin et al. |

FOREIGN PATENT DOCUMENTS

| | | |
|---|---|---|
| JP | 2007-133765 A | 5/2007 |
| JP | 2010-041012 A | 2/2010 |
| KR | 10-2010-00114847 A | 10/2010 |
| KR | 10-2010-0136091 A | 12/2010 |
| WO | 2011/008944 A2 | 1/2011 |

\* cited by examiner

PHOTOVOLTAIC MODULE

CROSS-REFERENCE TO RELATED APPLICATION

This application is a continuation application of U.S. patent application Ser. No. 13/437,357, filed Apr. 2, 2012, and claims the priority to and benefit of Korean Patent Nos. 10-2011-0060144, filed Jun. 21, 2011, and 10-2011-0073017, filed Jul. 22, 2011, in the Korean Intellectual Property Office, all of which are incorporated by reference in their entirety for all purposes as if fully set forth herein.

BACKGROUND OF THE INVENTION

1. Field of the Invention

The present invention relates to a photovoltaic module. More specifically, the present invention relates to a photovoltaic module capable of providing electrical power generated at solar cells to power grid through a simple connection to the power grid which supplies electrical power to home.

2. Description of the Related Art

Recently, as existing energy resources such as oil or coal are expected to be exhausted, an interest in alternative energy for replacing oil or coal is increasing. In particular, a solar cell which directly converts (or transforms) solar energy into electric energy by using a semiconductor element is getting the spotlight as a next-generation cell.

SUMMARY OF THE INVENTION

An aspect of the present invention provides a photovoltaic module capable of providing electrical power generated at solar cells to power grid which supplies electrical power to home.

According to an aspect of the present invention, there is provided a photovoltaic module comprising: a solar cell module, a micro-inverter to convert DC power generated by the solar cell module into AC power, a controller to control the micro-inverter's operation, and an interface unit connected to power grid supplying external electrical power and to provide AC power to the power grid, the controller to control operation of the micro-inverter such that AC power is matched to external electrical power flowing into the power grid.

According to another aspect of the present invention, there is provided a photovoltaic module comprising: a solar cell module comprising a front substrate, a rear surface substrate, and solar cells between the front and the rear surface substrate; a junction box disposed on the rear surface substrate and to prevent reversal of current of DC power generated at the solar cell module; an inverter disposed on the rear surface substrate and to convert the DC power supplied through the junction box into AC power; and an interface unit connected to power grid to which external electrical power is supplied and to provide the AC power to the power grid.

According to one embodiment of the present invention, a photovoltaic module, by employing a micro-inverter and an interface unit, can provide electrical power generated at solar cell modules through a simple connection to power grid which supplies electrical power to home, reducing consumption of electrical power flowing into home.

Also, by employing a monitoring unit comprising a display, the amount of electrical power produced at photovoltaic modules can be checked in real-time.

Also, according to another embodiment of the present invention, since a frame supporting solar cell modules comprises a cover unit covering an inverter, heat produced at the inverter can be radiated effectively.

The foregoing and other objects, features, aspects and advantages of the present invention will become more apparent from the following detailed description of the present invention when taken in conjunction with the accompanying drawings.

DETAILED DESCRIPTION OF THE INVENTION

Exemplary embodiments of the present invention will now be described in detail with reference to the accompanying drawings.

In the description of each constituting element, if the element is described to be formed "on" or "under" something, it includes all of the cases where the element is formed "directly" or "indirectly" through other constituting element.

In the following description, usage of suffixes such as 'module', 'part' or 'unit' used for referring to elements is given merely to facilitate explanation of the present invention, without having any significant meaning by itself. Thus, the 'module' and 'part' may be mixedly used.

Figure 1:
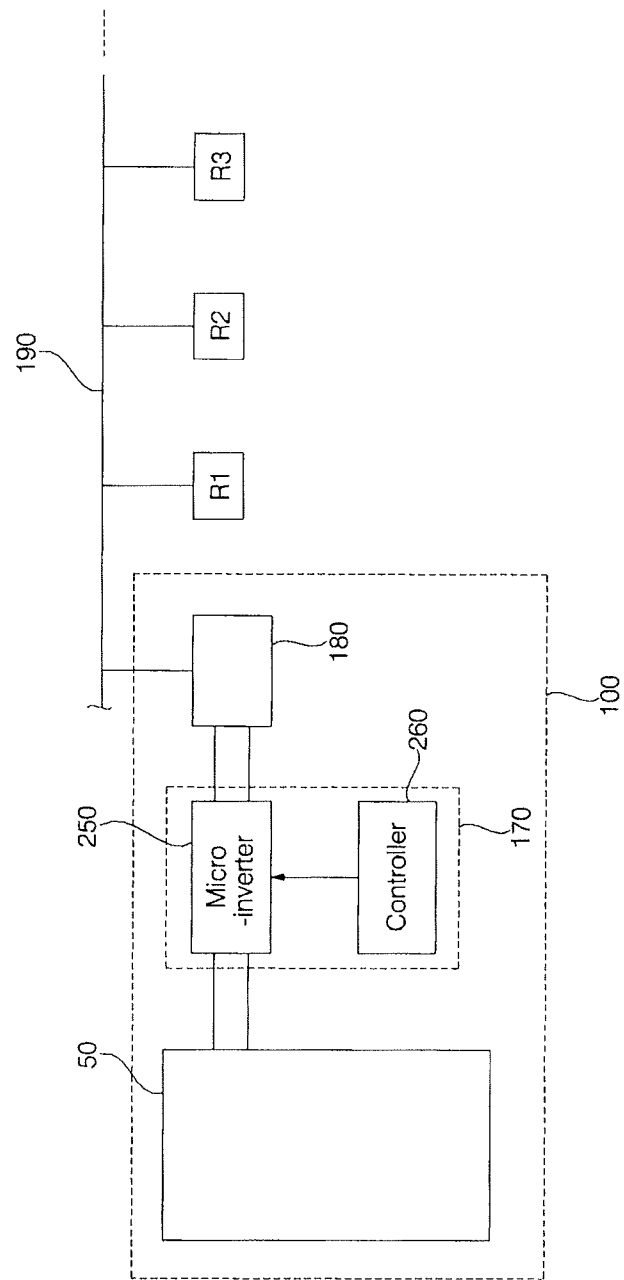
FIG. 1 is a view of a structure of a photovoltaic module according to one embodiment of the present invention.

FIG. 1 is a view of a structure of a photovoltaic module according to one embodiment of the present invention. With reference to FIG. 1, a photovoltaic module 100 according to one embodiment of the present invention comprises a solar cell module 50, a junction box 170, and an interface unit 180 capable of connecting to power grid 190. The junction box 170 can comprise a micro-inverter 250 and a controller 260.

Meanwhile, though FIG. 1 illustrates a photovoltaic module 100 incorporating one solar cell module 50 and one junction box 170, the photovoltaic module 100 can incorporate a plurality of solar cell modules 50 and one junction box 170. In a similar way, the photovoltaic module 100 can incorporate one solar cell module 50 and as many junction boxes 170 as the number of solar cell strings within the solar cell module. In what follows, the embodiment will be described based on the photovoltaic module 100 of FIG. 1.

The solar cell module 50 converts solar energy into DC power. The solar cell module 50 will be described in detail later with reference to FIGS. 2 to 5.

The micro-inverter 250 converts DC power generated at the solar cell module 50 into AC power. To this purpose, the micro-inverter 250 can employ a plurality of switching elements, for which description will be given later with reference to FIG. 6.

The interface unit 180, connecting to power grid 190 through which external electrical power is supplied to home, provides AC power converted by the micro-inverter 250 to the power grid 190. The interface unit 180 can be in the form of an outlet, a plug, or a combination of both.

As one example, power grid 190 connected to home can be an electricity distribution network of home to which electrical power supplied by an electrical power company is provided. In the power grid 190, various devices operated by AC power such as R1, R2, R3, and so on can be connected in parallel to each other by multiple outlets in home.

The interface unit 180, plugged into an arbitrary one among multiple outlets connected to the power grid 190, can be connected to the power grid 190. Accordingly, the photovoltaic module 100 operating as a new power source is also connected in parallel. Since part of electrical power consumed by AC devices is provided by the photovoltaic module 100, consumption of external power flowing into home can be reduced.

Meanwhile, since external electrical power supplied through the power grid 190 and the AC power provided by the micro-inverter 250 are all AC power, the phase of which varies as time elapses, phase matching between the two power sources should be made in order not to distort waveforms due to overlapping of the two AC power sources.

In particular, frequencies and phases of the two AC power sources should be identical to each other to prevent attenuation of amplitudes and distortion of waveforms due to overlapping of the two AC power sources. Also, only if the amplitude of AC power converted and provided by the micro-inverter 250 and that of external power source supplied through the power grid 190 are the same to each other, the AC power converted and provided by the micro-inverter 250 is delivered effectively to the power grid 190.

On the other hand, for example, if external power supplied through the power grid 190 is assumed to be AC power of 220V and 60 Hz, the voltage and frequency of the external power source is not always maintained at the specified values, being supplied within some tolerance and variations.

The variations of the external power are detected by the interface unit 180 or a monitoring unit (210 of FIG. 9) described later in FIG. 9. Based on the detection result, operation of the micro-inverter 250 is controlled such that external power supplied through the power grid 190 and AC power converted and provided by the micro-inverter 250 are matched to each other.

In other words, operation of the micro-inverter 250 is controlled such that output current detected at an output current detection module (E of FIG. 6) and output voltage detected at an output voltage detection unit (F of FIG. 6) of the micro-inverter 250 are matched to the external power detected at the interface unit 180 or the monitoring unit (210 of FIG. 9) described later in FIG. 9.

For example, if voltage of an external power source flowing into the power grid 190 increases instantaneously, the controller 260 controls operation of the micro-inverter 250 in such a way to increase the turn-on duty of a switching element within the micro-inverter 250 so that output level of current and voltage of the micro-inverter 250 are increased immediately.

Figure 2:
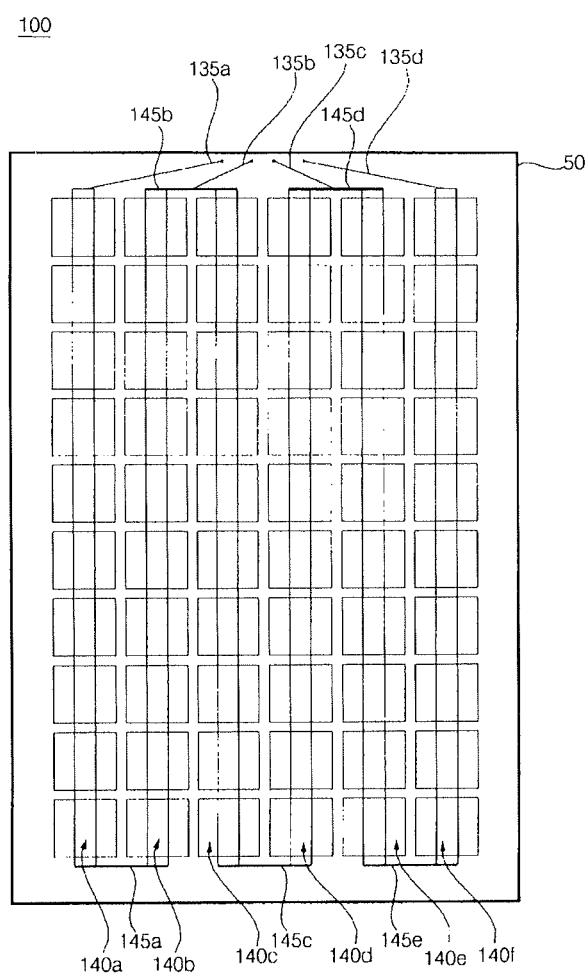
FIG. 2 is a front view of a photovoltaic module according to an embodiment of the present invention.
Figure 3:
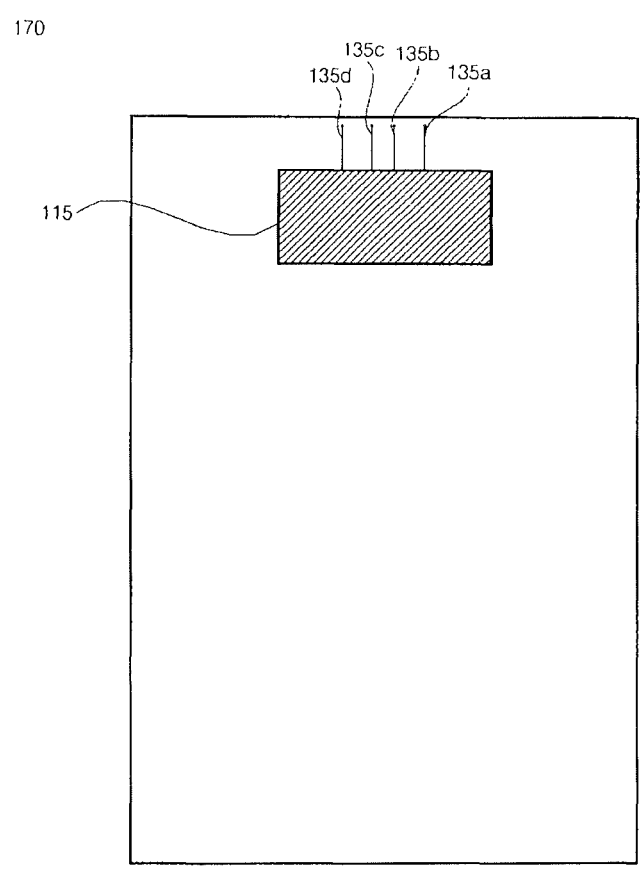
FIG. 3 is a rear view of a photovoltaic module of FIG. 2.

FIG. 2 is a front view of a photovoltaic module according to an embodiment of the present invention; FIG. 3 is a rear view of a photovoltaic module of FIG. 2; and FIG. 4 is a disassembled perspective view of a solar cell module of FIG. 2.

Figure 4:
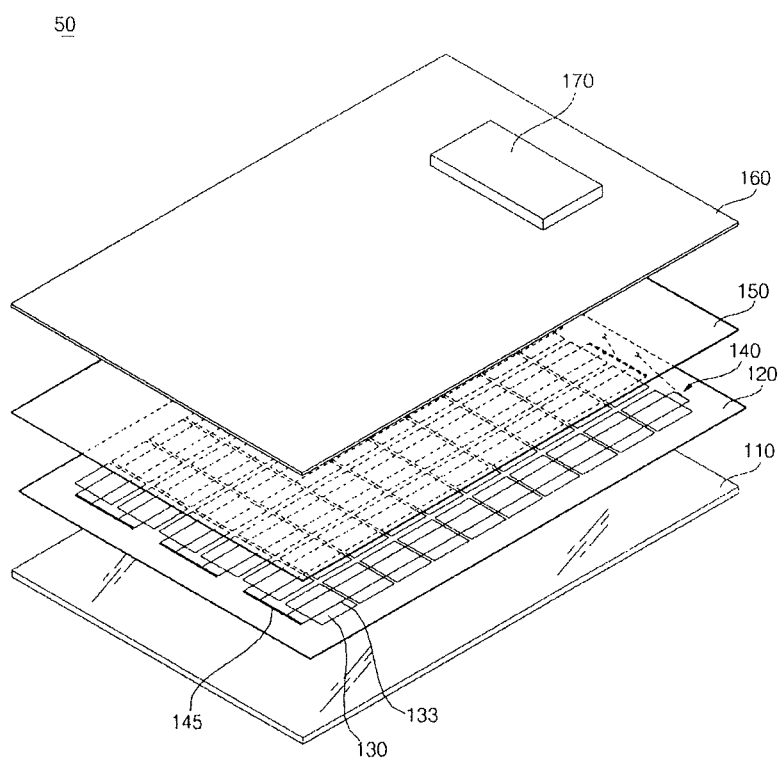
FIG. 4 is a disassembled perspective view of a solar cell module of FIG. 2.

With reference to FIGS. 2 to 4, a photovoltaic module 100 according to an embodiment of the present invention can comprise a solar cell module 50 and a junction box 170 disposed on one surface of the solar cell module 50. The photovoltaic module 100 can further comprise a heat releasing member disposed between the solar cell module 50 and the junction box 170.

First, the solar cell module 50 can comprise a plurality of solar cells 130. Besides, the solar cell module 50 can further comprise a first 120 and a second sealing member 150 disposed on an upper surface and a lower surface of a plurality of solar cells 130; and a front substrate 110 disposed on an upper surface of the first sealing member 120 and a rear substrate 160 disposed on an upper surface of the second sealing member 150.

Each of the solar cells 130 is a semiconductor device converting solar energy into electric energy and may be a silicon solar cell, a compound semiconductor solar cell, a tandem solar cell, a dye-sensitized solar cell, a CdTe or CIGS type solar cell, or the like.

Each of the solar cells 130 is configured to have a light receiving face to which solar light is made incident and a rear face, which is the opposite to the light receiving face.

For example, each of the solar cells 130 may include a silicon substrate having a first conductivity type, a semiconductor layer formed on the silicon substrate and having a second conductivity type which is the opposite to the first conductivity type, an anti-reflective film formed on the second conductivity type semiconductor layer, a front electrode in contact with a portion of the second conductivity type semiconductor layer through the anti-reflective film, and a rear electrode formed on a rear surface of the silicon substrate.

The plurality of solar cells 130 form a string 140 being connected electrically in series, in parallel, or in series-parallel by a ribbon 133. More specifically, the ribbon 133 can connect the front surface electrode formed on the light receiving surface of the solar cell 130 with the rear surface electrode formed on the other surface of the other adjacent solar cell 130 by employing a tabbing process. The tabbing process applies flux on one surface of the solar cell 130 and disposes the ribbon 133 on the solar cell 130 with the flux applied and carries out a thermal treatment process.

Also, a plurality of solar cells 130 can be connected in series or in parallel by attaching a conductive film (not shown) between one surface of the solar cell 130 and the ribbon 133 and applying thermal press. The conductive film (not shown) is formed in such a way that conductive particles with excellent conductivity such as gold, silver, nickel, copper, and so on are distributed within a film formed by epoxy resin, acryl resin, polyimide resin, polycarbonate resin, and so on. The conductive particles are exposed to the outside of the film due to thermal press and the solar cell 130 and the ribbon 133 can be connected electrically to each other due to the exposed conductive particles. As described above, if a plurality of solar cells 130 are modularized as they are connected due to the conductive film (not shown), a process temperature can be lowered and thus bending of the string 140 can be prevented.

The figure illustrates that the ribbon 133 is formed by two strings and due to the ribbon 133, solar cells 130 are connected in series, forming a solar cell string 140. The figure also illustrates that according to the above, six strings 140a, 140b, 140c, 140d, 140e, 140f are formed and each string is equipped with ten solar cells. It should be understood that various modifications all possible in addition to the illustration of the figure.

Also, each solar cell string can be connected electrically to each other through a bus ribbon. FIG. 2 illustrates a case where due to the respective bus ribbons 145a, 145c, 145e disposed in a lower part of the solar cell module 50, a first solar cell string 140a and a second solar cell string 140b; a third solar cell string 140c and a fourth solar cell string 140d; and a fifth solar cell string 140e and a sixth solar cell string 140f are connected electrically to each other. FIG. 2 also illustrates that due to the respective bus ribbons 145b, 145d disposed in an upper part of the solar cell module 50, the second solar cell string 140b and the third solar cell string 140c; and the fourth solar cell string 140d and the fifth solar cell string 140e are connected electrically to each other.

Meanwhile, the ribbon connected to the first string, the bus ribbon 145b, 145d, and the ribbon connected to the fourth string are connected electrically to a first to a fourth conductive line 135a, 135b, 135c, 135d while the first to the fourth conductive line 135a, 135b, 135c, 135d are connected to bypass diodes Da, Db, Dc within the junction box 170 disposed on the back surface of the solar cell module 50. The figure illustrates that the first to the fourth conductive line 135a, 135b, 135c, 135d are extended to the back surface of the solar cell module 50 through the openings formed on the solar cell module 50.

On the other hand, it is preferred that the junction box 170 is disposed closer to one of the two end parts of the solar cell module 50 to which conductive lines are extended.

FIGS. 2 and 3 illustrate that since the first to the fourth conductive line 135a, 135b, 135c, 135d are extended for the upper part of the solar cell module 50 to the back surface of the solar cell module 50, the junction box 170 is disposed on an upper part of the back surface of the solar cell module 50. Accordingly, the length of the conductive line can be shortened, thereby reducing power consumption.

Different from FIGS. 2 and 3, if the first to the fourth conductive line 135a, 135b, 135c, 135d are extended from a lower part of the solar cell module 50 to the back surface of the solar cell module 50, the junction box 170 can be disposed in a lower part of the back surface of the solar cell module 50.

A first sealing member 120 is disposed on a light receiving surface of the solar cell 130 and a second sealing member 150 is disposed on the other surface of the solar cell 130. The first 120 and the second sealing member 150 are fastened to each other by lamination, isolating moisture or oxygen imposing an adverse effect on the solar cell 130. For the first 120 and the second sealing member 150, ethylene vinyl acetate (EVA) copolymer resin, polyvinyl butyral, ethylene vinyl acetate partial oxide, silicon resin, ester resin, olefin resin, etc. can be employed.

It is preferable that the front substrate 110 is positioned on the first sealing member 120 and the front substrate 110 is made of reinforced glass to protect the solar cell 130 from external shocks and let solar energy pass through. Also, it is more preferable that low iron reinforced glass is used for preventing reflection of solar energy and increasing permeability of solar energy.

The rear substrate 160 is a layer intended to protect solar cells at the other surface of the solar cell 130 providing functions of water proofing, insulation, and ultraviolet blocking. The rear substrate 160 can be TPT (Tedlar/PET/Tedlar) type but is not limited to the above. Also, it is preferred that the rear substrate 160 is made of a material with excellent reflectivity in order to reflect solar energy coming from the front substrate 110 and reuse the reflected solar energy. However, the rear substrate 160 can be formed by a transparent material through which solar energy can pass, thereby implementing a double-sided solar cell module.

Figure 11:
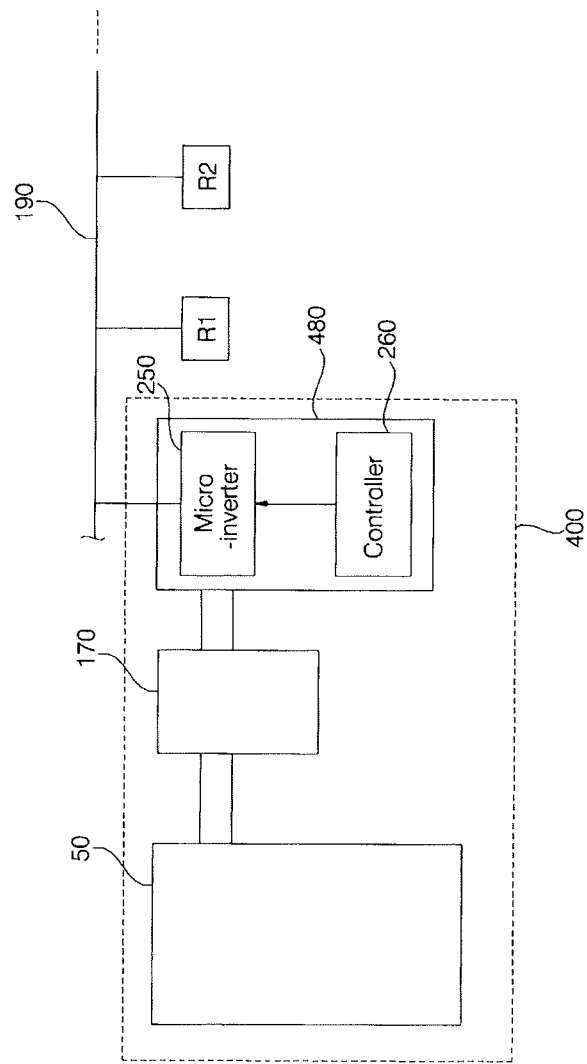
FIG. 11 illustrates a structure of a photovoltaic module according to one embodiment of the present invention.

As described above, the solar cell module 50 generates DC current and the micro-inverter described in FIG. 1 converts DC power supplied from the solar cell module 50 into AC power and outputs the AC power converted. As one example, the micro-inverter can be disposed within the junction box 170 described later but is not limited to the above. For instance, the micro-inverter can be installed inside the interface unit 180 as illustrated in FIG. 11.

The junction box 170 is disposed on the back surface of the solar cell module 50 and comprises bypass diodes Da, Db, Dc protecting reversal of current among solar cell strings. Also, the junction box 170 can comprise a capacitor unit storing DC power and can also comprise circuit elements such as the micro-inverter and the controller described in FIG. 1. Water blocking coating can be applied for the inside of the junction box 170 to protect the circuit elements.

When the junction box 170 operates, heat having a high temperature is generated from the bypass diodes Da, Db, and Dc, or the like. The generated heat may reduce the efficiency of particular solar cells 130 arranged at the position where the junction box 170 is attached.

Thus, in order to prevent the problem, the photovoltaic module 100 according to an embodiment of the present invention can further comprise a heat releasing member (not shown) disposed between the solar cell module 50 and the junction box 170. At this time, to dissipate heat generated from the junction box 170 effectively, it is preferred that the area of the heat releasing member (not shown) is larger than that of the junction box 170. For example, the heat releasing member can be formed across the entire back surface of the solar cell module 50. Also, it is preferable that the heat releasing member (not shown) is formed by metallic substance with excellent thermal conductivity such as Au, Ag, Cu, Al, and W.

Figure 5:
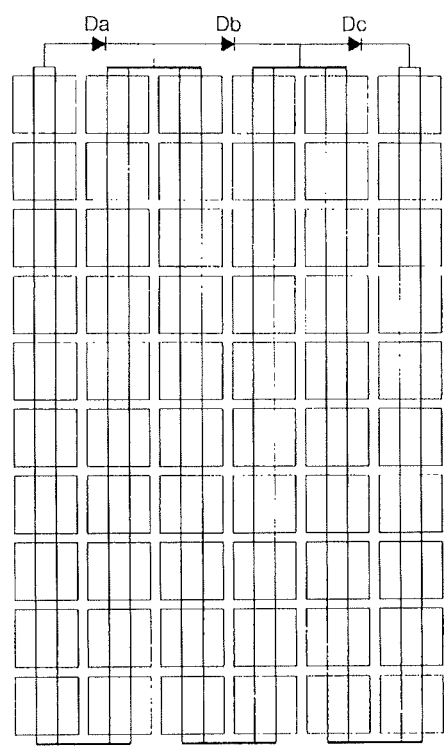
FIG. 5 is one example of incorporating bypass diodes in the photovoltaic module of FIG. 2.

FIG. 5 is one example of incorporating bypass diodes in the photovoltaic module of FIG. 2.

With reference to the figure, bypass diodes Da, Db, Dc can be connected in accordance to six solar cell strings 140a, 140b, 140c, 140d, 140e, 140f. More specifically, a first bypass diode Da, being connected between the first solar cell string and the first bus ribbon 145a, bypasses the first solar cell string 140a and the second solar cell string 140b when reverse voltage is generated at the first solar cell string 140*a* or the second solar cell string 140*b*.

For example, if voltage of approximately 0.6V, which is common in a normal solar cell, is generated, the potential at cathode of the first bypass diode Da becomes higher than that at anode by approximately 12 V(=0.6V*20). In other words, the first bypass diode Da carries out normal operation rather than bypass operation.

Meanwhile, when a hot spot occurs as shade occurs in a solar cell of the first solar cell string 140*a* or as a foreign object is attached, a reverse voltage (about 15V), not the voltage of about 0.6V, is generated from a solar cell. Accordingly, the potential of the anode electrode of the first bypass diode Da is higher by about 15V than that of the cathode electrode. Then, the first bypass diode Da performs a bypassing operation. Thus, the voltage generated in the solar cells in the first solar cell string 140*a* and the second solar cell string 140*b* is not supplied to the junction box 170. In this manner, when a reverse voltage is generated in some of the solar cells, it is bypassed, thus preventing the corresponding solar cells, or the like, from being damaged. Also, generated DC power can be supplied, except for the hot spot area.

The second bypass diode Db is connected between the first bus ribbon 145*a* and the second bus ribbon 145*b*, and when a reverse voltage is generated in the third solar cell string 140*c* or the fourth solar cell string 140*d*, the second bypass diode Db bypasses the third solar cell string 140*c* and the fourth solar cell string 140*d*.

The third bypass diode Dc is connected between the first solar cell string and the first bus ribbon 145*a*, and when a reverse voltage is generated in the first solar cell string 140*a* or the second solar cell string 140*b*, the third bypass diode Dc bypasses the first solar cell string and the second solar cell string.

Meanwhile, different from FIG. 5, connecting six bypass diodes is also possible in accordance to the six solar cell strings and various modifications other than the above are possible.

Figure 6:
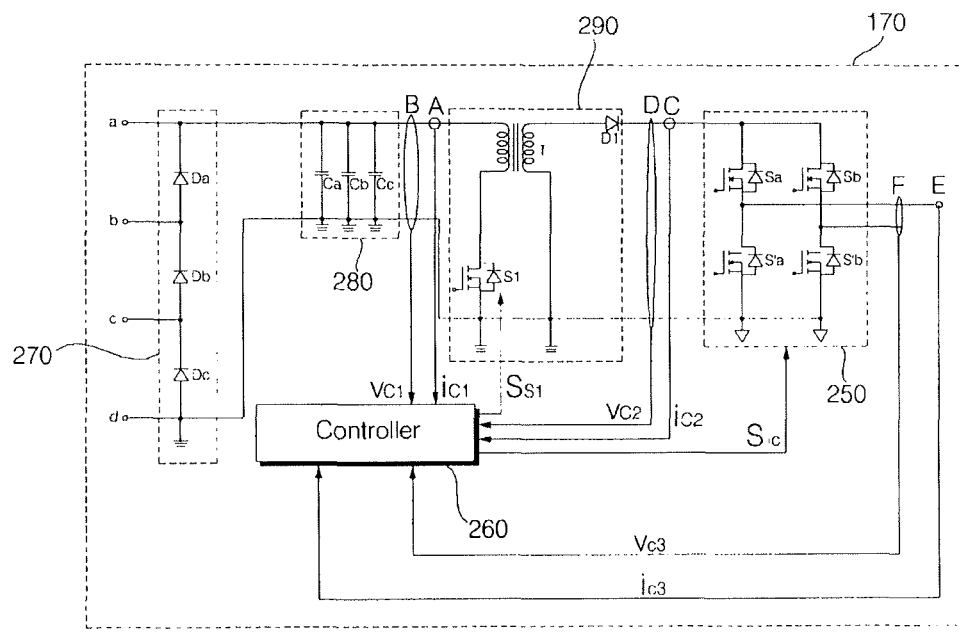
FIG. 6 is one example of an internal circuit diagram of a junction box of the photovoltaic module of FIG. 2.

FIG. 6 is one example of an internal circuit diagram of a junction box of the photovoltaic module of FIG. 2.

With reference to FIG. 6, the junction box 170 can comprise a diode unit 270, a capacitor unit 280, a micro-inverter 250, and a controller 260. Also, the junction box 170 can further comprise a converter 290 between the micro-inverter 250 and the capacitor unit 280.

The bypass diode unit 270 comprises a first to a third bypass diode Da, Db, Dc disposed between a, b, c, and d node corresponding respectively to the first to the fourth conductive line 135*a*, 135*b*, 135*c*, 135*d*.

The capacitor unit 280 stores DC power provided from the solar cell module 50. FIG. 6 illustrates a case where three capacitors Ca, Cb, Cc are connected in parallel to each other; however, a series connection or a series-parallel connection is equally possible.

The micro-inverter 250 converts DC voltage to AC voltage. The figure illustrates the case of a full-bridge inverter. In other words, upper arm switching elements Sa, Sb and lower arm switching elements S'a, S'b connected in series with each other make a pair, respectively and a total of two pairs of upper and lower arm switching elements are connected in parallel to each other. A diode is connected to each switching element Sa, S'a, Sb, S'b in reverse-parallel direction.

Figure 10:
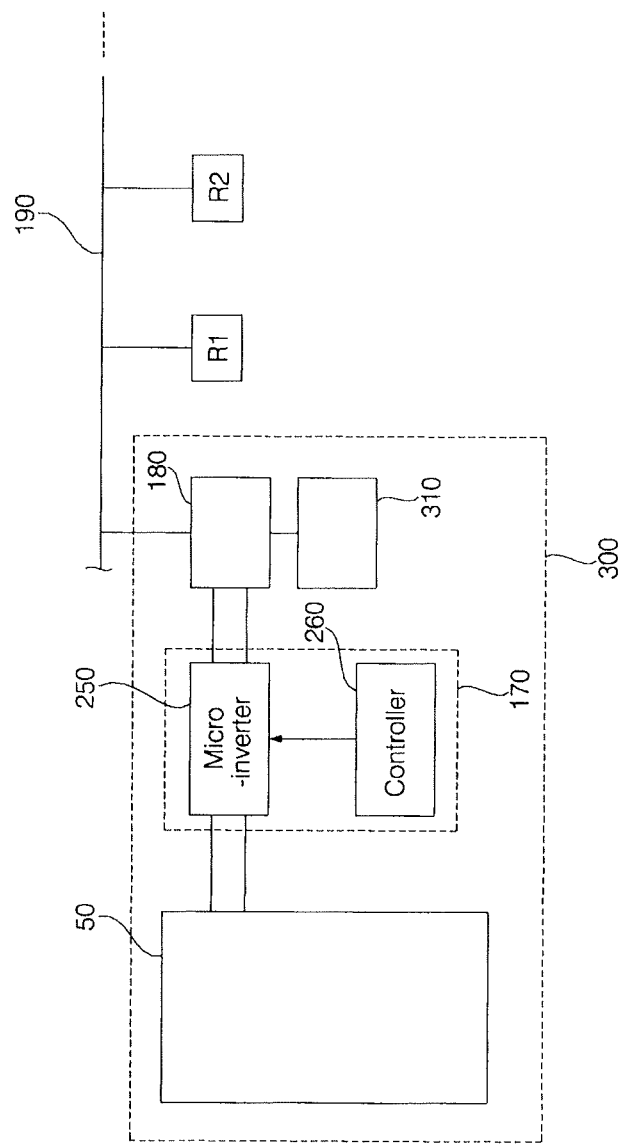
FIG. 10 illustrates a structure of a photovoltaic module according to one embodiment of the present invention.

Meanwhile, since the photovoltaic module 100 according to the present invention attempts to provide electrical power while being connected to the power grid (190 of FIG. 1) through a parallel connection, external power supplied to the power grid (190 of FIG. 10 and AC power converted and provided by the micro-inverter 250 should be matched to each other in order not to distort waveforms due to overlapping of the AC power sources.

Therefore, the controller 260 controls operation of the micro-inverter 250 such that output current ic3 detected at the output current detection unit E and output voltage Vc3 detected at the output voltage detection unit F of the micro-inverter 250 match with an external power source. In other words, switching elements within the micro-inverter 250, based on an inverter switching control signal from the controller 260, performs on-off operation. According to the on-off operation, AC power of predetermined frequency is output.

For example, if voltage of an external power source flowing into the power grid (190 of FIG. 1) increases instantaneously, the controller 260 controls operation of the micro-inverter 250 in such a way to increase the turn-on duty of a switching element within the micro-inverter 250 so that output level of current and voltage of the micro-inverter 250 are increased immediately.

Meanwhile, the converter 290 can be further included between the micro-inverter 250 and the capacitor unit 280. The converter 290 carries out a level conversion by using a DC power stored in the capacitor unit 280. The figure illustrates a turn-on timing of a switching element S1 and a flyback converter employing the turns ratio of a transformer T. By using the above, voltage boosting of the DC power is carried out and the boosted DC voltage can be provided to the micro-inverter 250.

On the other hand, the input current detection unit A detects a current ic1 supplied to the converter 290 while the input voltage detection unit B detects voltage vc1 input to the converter 290, namely, the voltage stored in the capacitor unit 280. The detected current ic1 and voltage vc1 are input to the controller 260.

In addition, the output current detection unit C detects a current ic2 output from the converter 290 while the output voltage detection unit D detects voltage vc2 output from the converter 290. The detected current ic2 and voltage vc2 are input to the controller 260.

At this time, the controller 260 controls the operation of the converter 290 by determining whether the detected DC current ic1, ic2 and DC voltage vc1, vc2 can be converted to a level at which the micro-inverter 250 generates outputs.

Also, the controller 260 can perform power optimization control by employing a maximum power point tracking (MPPT) algorithm, which will be described later with reference to FIGS. 7 and 8.

Figure 7:
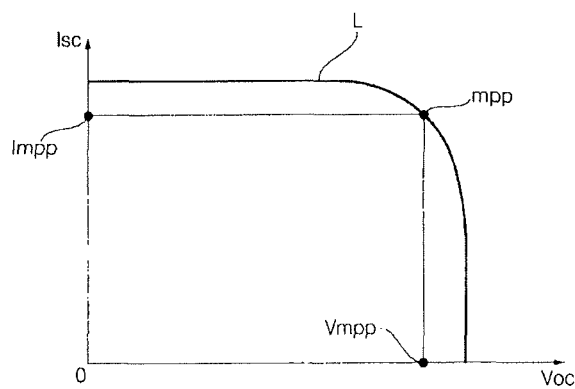
FIG. 7 illustrates a voltage-current curve of the solar cell module of FIG. 2.

FIG. 7 illustrates a voltage-current curve of the solar cell module of FIG. 2; FIG. 8 illustrates a voltage-power curve of the solar cell module of FIG. 2.

First, with reference to FIG. 7, the bigger the open-circuit voltage Voc supplied from the solar cell module 50, the smaller the short-circuit current supplied from the solar cell module 50. According to the voltage-current curve L, the corresponding voltage Voc is stored in the capacitor unit 280 installed within the junction box 170.

Figure 8:
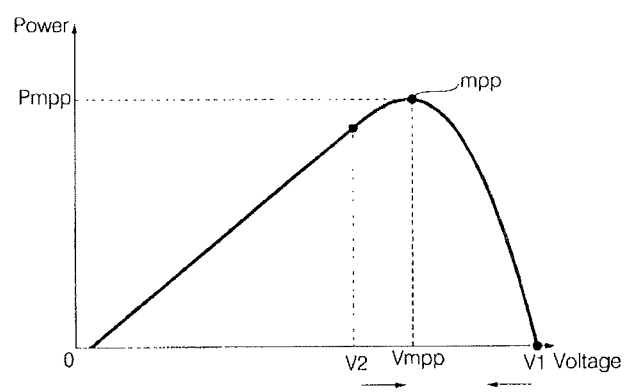
FIG. 8 illustrates a voltage-power curve of the solar cell module of FIG. 2.

Meanwhile, with reference to FIG. 8, the maximum power Pmpp supplied from the solar cell module 50 can be calculated by using the maximum power point tracking (MPPT) algorithm. For example, electrical power is calculated for each voltage as the open-circuit voltage Voc is gradually decreased from the maximum voltage V1 and determines whether the electrical power calculated corresponds to the maximum electrical power. Since electrical power increases for a range from V1 to Vmpp voltage, electrical power calculated is updated and stored. And since electrical power decreases for a range from Vmpp to V2 voltage, Pmpp corresponding to Vmpp voltage is determined eventually as the maximum electrical power.

On the other hand, the MPPT algorithm can be performed by taking account of the characteristics of the other solar cell module (input voltage or output power). In other words, power optimization can be carried out by taking the characteristics of the other module into consideration.

Figure 9:
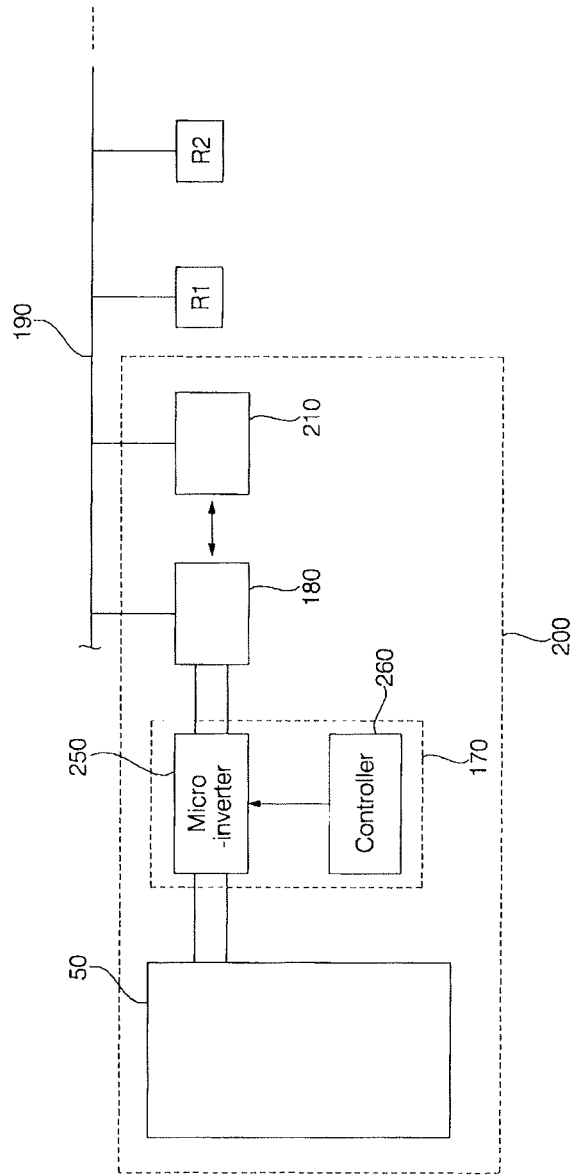
FIG. 9 illustrates a structure of a photovoltaic module according to one embodiment of the present invention.

FIG. 9 illustrates a structure of a photovoltaic module according to one embodiment of the present invention.

With reference to FIG. 9, a photovoltaic module 200 according to one embodiment of the present invention comprises a solar cell module 50; a junction box which can comprise a micro-inverter 250 and a controller 260; and an interface unit 180 capable of connecting to power grid 190. The photovoltaic module 200 can further comprise a monitoring unit 210 which connects to the power grid 190 at a position separated from the interface unit 180.

The interface unit 180 is connected to the power grid 190 and accordingly, a photovoltaic module 100 which performs as a new power source is connected in parallel to an external power source supplying power to the power grid 190. Therefore, since part of power consumed in AC power devices is provided by the photovoltaic module 100, consumption of the external power flowing into home can be reduced.

Also, the interface unit 180 or the junction box 170 can comprise a first communication module (not shown) for communication with the monitoring unit 210. The first communication module (not shown) transmits electrical power generated by the photovoltaic module 200 to the monitoring unit 210 based on the output current ic3 and the output voltage Vc3 detected at the output current detection unit (E of FIG. 8) and the output voltage detection unit (F of FIG. 8).

The monitoring unit 210 comprises a second communication module and a display. Therefore, the monitoring unit 210 receives the amount of electrical power generated by the photovoltaic module 100 transmitted by the first communication module disposed within the interface unit 180 or the junction box 170 and displays the received amount of electrical power on the display. Also, the monitoring unit 210 detects external electrical power flowing into the power grid 190 and displays the detected external electrical power on the display, which is further transmitted to a second communication module (not shown) within the interface unit 180 or the junction box 170.

Communication between the second communication module of the monitoring unit 210 and the first communication module disposed within the interface unit 180 or the junction box 170 can be carried out by short-range communication such as Wi-Fi, power line communication, etc. but is not limited to the above.

Meanwhile, based on the information about external electrical power received by the communication module within the interface unit 180 or the junction box 170, the controller 260 controls the operation of the micro-inverter 250 such that AC power converted and supplied by the micro-inverter 250 matches to external electrical power provided to the power grid 190.

As described above, when included is the monitoring unit 210 connected to the power grid 190 at a position separated from the interface unit 180, the amount of electrical power can be displayed on the display, supporting real-time checking of the amount of electrical power.

FIG. 10 illustrates a structure of a photovoltaic module according to one embodiment of the present invention; FIG. 11 illustrates a structure of a photovoltaic module according to one embodiment of the present invention.

First, with reference to FIG. 10, a photovoltaic module 300 according to one embodiment of the present invention comprises a solar cell module 50; a junction box which can comprise a micro-inverter 250 and a controller 260; and an interface unit 180 capable of connecting to power grid 190. The photovoltaic module 300 of FIG. 10 is the same as the photovoltaic module 200 of FIG. 9 but the figure illustrates that the monitoring unit 310 can be formed in a single body together with the interface unit 180 connected to the power grid 190.

Also, the photovoltaic module 400 of FIG. 11 comprises a solar cell module 50, a junction box 170, and an interface unit 180 capable of connecting to power grid 190. Different from the photovoltaic module 100 of FIG. 1, the figure illustrates that the micro-inverter 250 and the controller 260 can be disposed within the interface unit 480.

Meanwhile, the photovoltaic module 400 of FIG. 11 can also further comprise the monitoring unit which is the same as shown in FIGS. 9 and 10.

Figure 12:
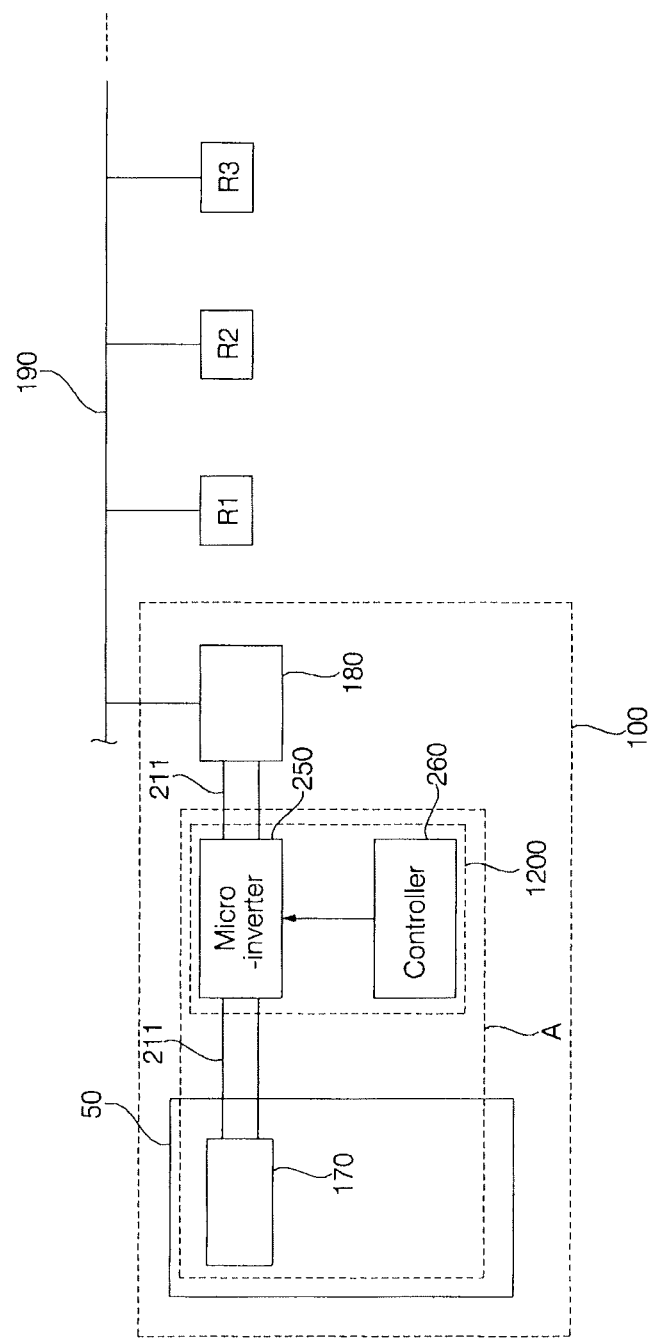
FIG. 12 illustrates a structure of a photovoltaic module according to another embodiment of the present invention.

FIG. 12 illustrates a structure of a photovoltaic module according to another embodiment of the present invention.

With reference to FIG. 12, a photovoltaic module 100 according to one embodiment of the present invention comprises a solar cell module 50, a junction box 170, an inverter 1200, and an interface unit 180 capable of connecting to power grid 190. The inverter 1200 can comprise a micro-inverter 250 and a controller 260.

First, the solar cell module 50 generates DC power from solar energy. The solar cell module 50 will be described in detail later with reference to FIGS. 13 to 16.

The junction box 170 is disposed on the back surface of the solar cell module 50 and prevents reversal of current among solar cell strings and can comprise bypass diodes Da, Db, Dc.

The inverter 1200 can comprise the micro-inverter 250 and the controller 260 for converting DC power produced at the solar cell module 50 to AC power.

The micro-inverter 250 converts DC power produced at the solar cell module 50 into AC power. To this purpose, the micro-inverter 250 incorporates multiple switching elements. Also, the controller 260 controls operation of the micro-inverter 250.

The interface unit 180, being connected to the power grid 190 through which external electrical power flows into home, provides AC power converted by the micro-inverter 250 to the power grid 190. Descriptions about the interface unit 180 will be omitted with reference to FIG. 1.

Meanwhile, the junction box 170, the inverter 1200, and the interface unit 180 can be connected easily by employing a cable 211. Description of the cable 211 will be given later with reference to FIG. 17.

Figure 13:
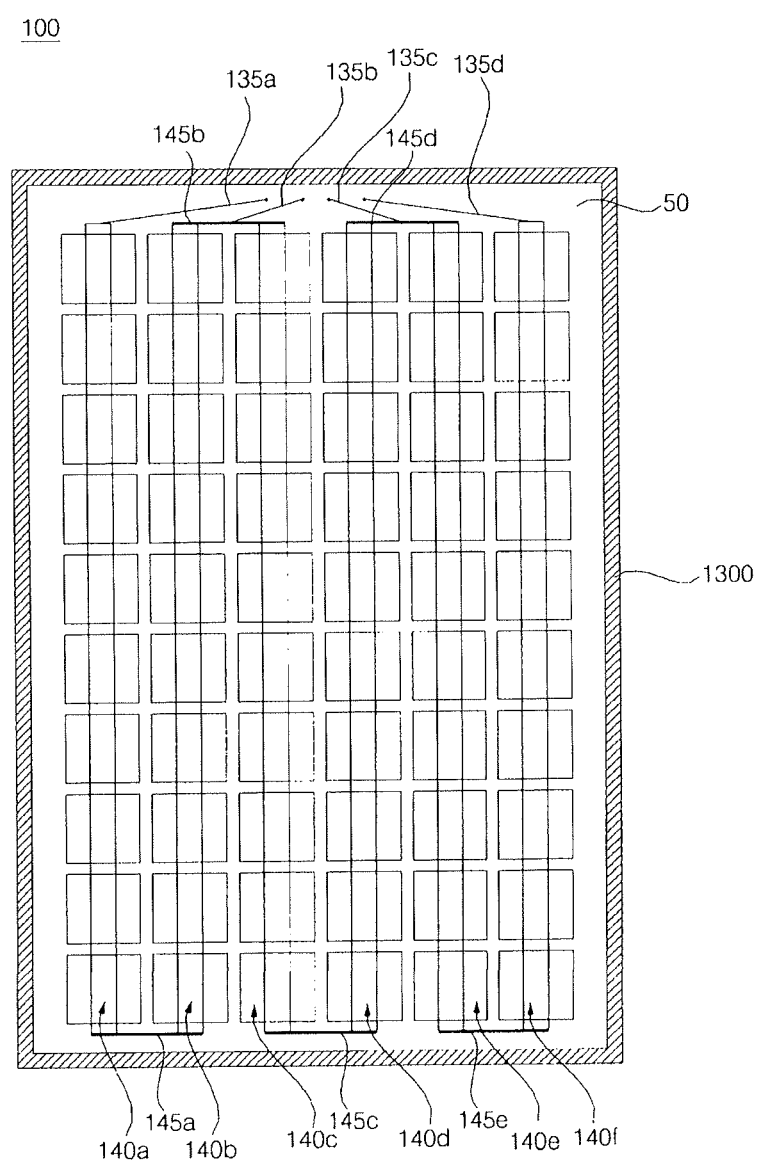
FIG. 13 illustrates a structure of a photovoltaic module according to another embodiment of the present invention.
Figure 14:
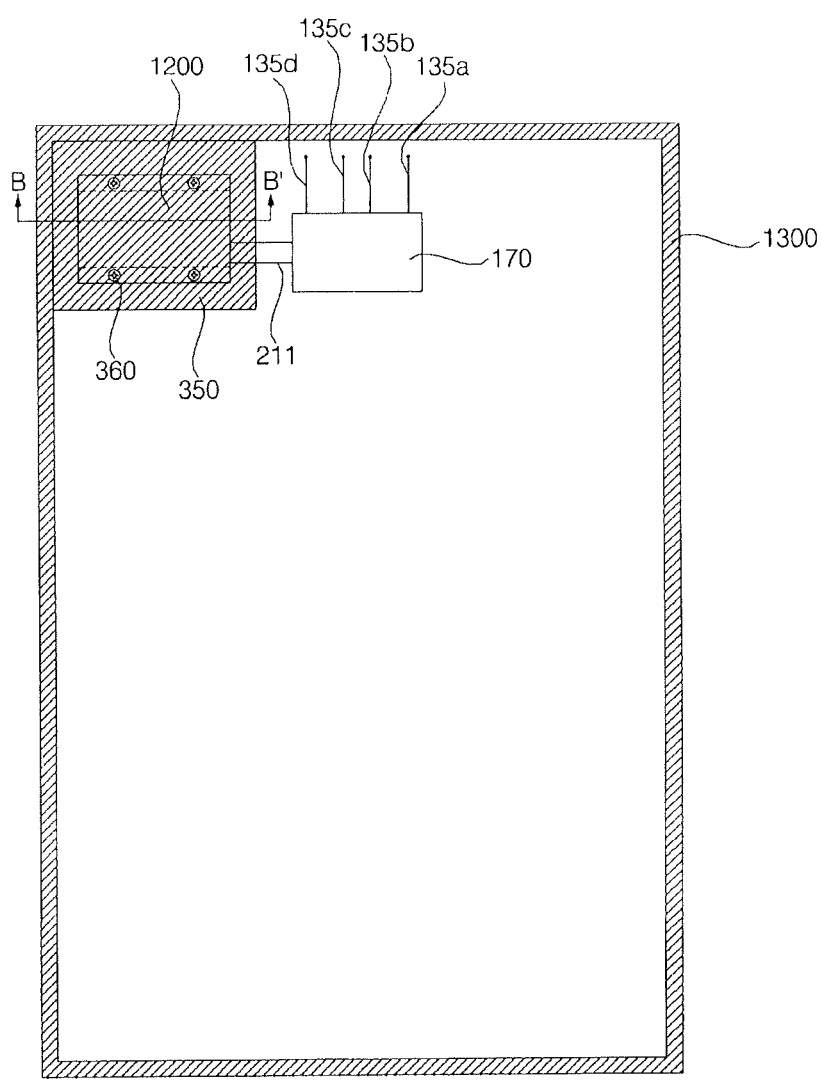
FIG. 14 is a rear view of the photovoltaic module of FIG. 13.
Figure 15:
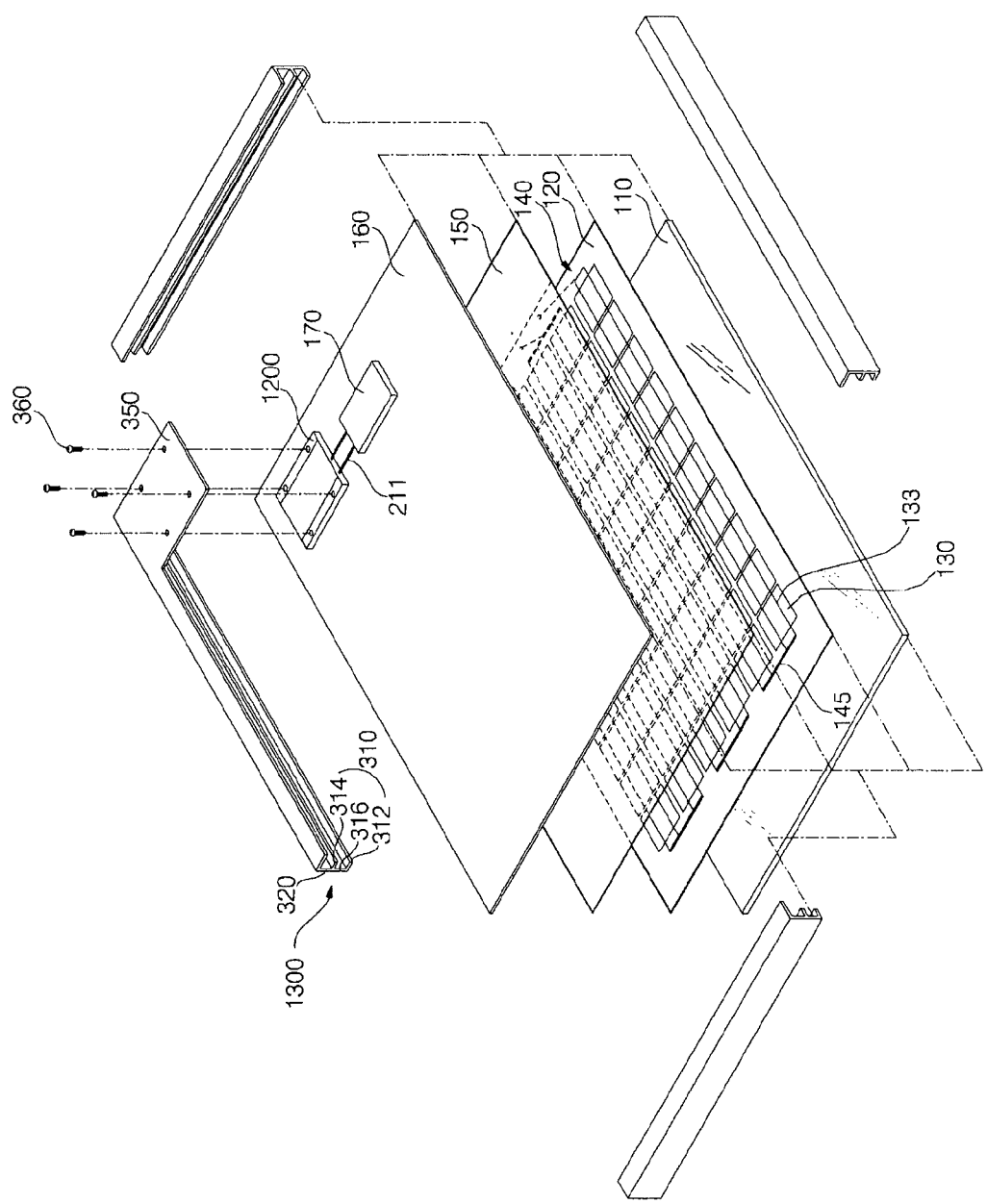
FIG. 15 is a disassembled perspective view of the solar cell module of FIG. 13.
Figure 16:
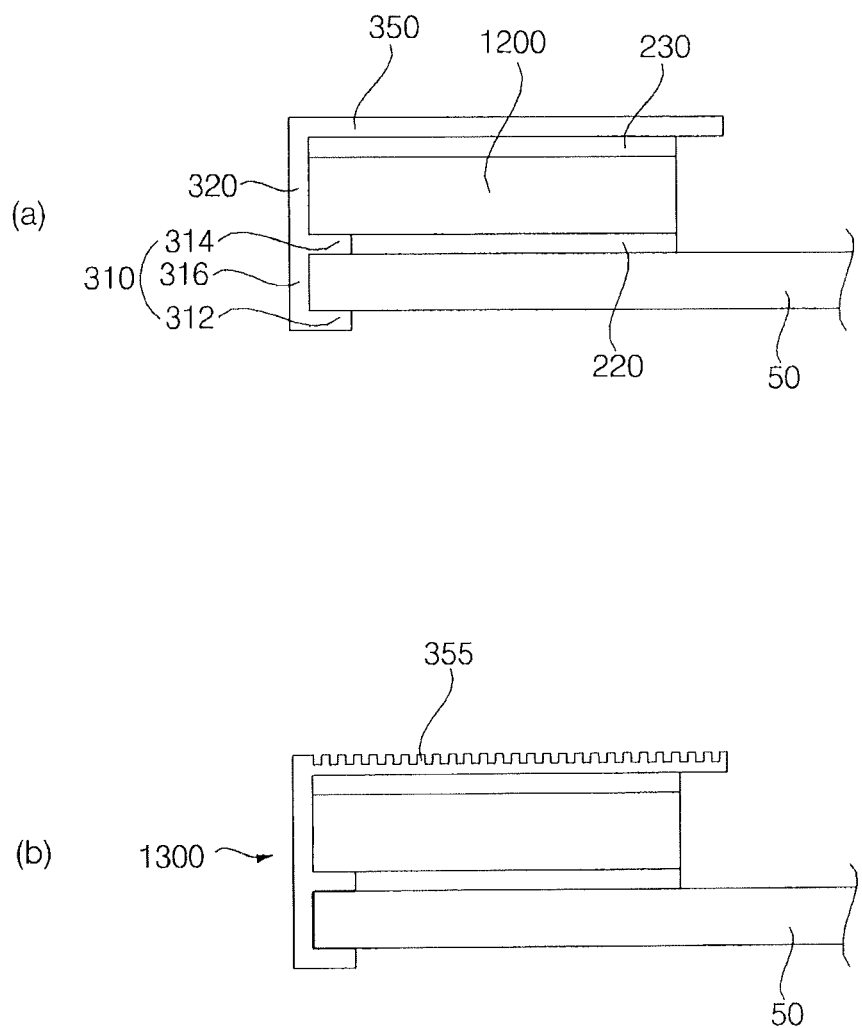
FIG. 16 illustrates a cross-section as seen along B-B' of FIG. 14.

FIG. 13 illustrates a structure of a photovoltaic module according to another embodiment of the present invention; FIG. 14 is a rear view of the photovoltaic module of FIG. 13; FIG. 15 is a disassembled perspective view of the solar cell module of FIG. 13; and FIG. 16 illustrates a cross-section as seen along B-B' of FIG. 14.

With reference to FIGS. 13 to 16, a photovoltaic module 100 according to an embodiment of the present invention can comprise a solar cell module 50; a frame 1300 being combined with the periphery of the solar cell module 50 and supporting the solar cell module 50; and a junction box 170 and an inverter 1200 disposed on one surface of the solar cell module 50.

The solar cell module 50 can comprise a plurality of solar cells 130. Description of the solar cell module 50 will be omitted with reference to FIGS. 2 to 5.

Each solar cell string can be connected electrically by the bus ribbon. FIG. 13 illustrates that due to the bus ribbon 145*a*, 145*c*, 145*e* disposed in a lower part of the solar cell module 50, the first solar cell string 140*a* and the second solar cell string 140*b*; the third solar cell string 140*c* and the fourth solar cell string 140*d*; and the fifth solar cell string 140*e* and the sixth solar cell string 140*f* are connected electrically to each other. Also, FIG. 13 illustrates that due to the bus ribbon 145*b*, 145*d* disposed in an upper part of the solar cell module 50, the second solar cell string 140*b* and the third solar cell string 140*c*; and the fourth solar cell string 140*d* and the fifth solar cell string 140*e* are connected electrically to each other.

The frame 1300, being combined with the periphery of the solar cell module 50, supports the solar cell module 50.

With reference to FIG. 15, the frame 1300 is equipped with an upper joint 312, a lower joint 314, and an arm-shaped joint 311 comprising a connecting joint 316 connecting the two joints and comprises a leg unit 320 extended from the connecting joint 316 and forming an L shaped cross-section. The arm-shaped joint 311 forms rectangular shaped space and as the solar cell module 50 is combined with the arm-shaped joint 311, the frame 1300 supports the solar cell module 50.

Meanwhile, though not shown in the figure, silicon is applied between the arm-shaped joint 311 and the solar cell module 50, absorbing external shocks, improving a binding force, and preventing penetration of foreign substance.

The junction box 170 can be disposed on the rear substrate 160 of the solar cell module 50 and can comprise bypass diodes to prevent reversal of DC power generated at the solar cell module 50. Therefore, the first to the fourth conductive line 135*a*, 135*b*, 135*c*, 135*d* described above are connected to the bypass diodes Da, Db, Dc within the junction box 170.

The figure illustrates the case where the first to the fourth conductive line 135*a*, 135*b*, 135*c*, 135*d* are extended to the rear surface of the solar cell module 50 through the openings formed on the solar cell module 50. At this time, it is preferred that the junction box 170 is disposed closer to one of the two end parts of the solar cell module 50 to which conductive lines are extended.

FIGS. 13 and 14 illustrate that since the first to the fourth conductive line 135*a*, 135*b*, 135*c*, 135*d* are extended for the upper part of the solar cell module 50 to the back surface of the solar cell module 50, the junction box 170 is disposed on an upper part of the back surface of the solar cell module 50. Accordingly, the length of the conductive line can be shortened, thereby reducing power consumption.

Different from FIGS. 13 and 14, if the first to the fourth conductive line 135*a*, 135*b*, 135*c*, 135*d* are extended from a lower part of the solar cell module 50 to the back surface of the solar cell module 50, the junction box 170 can be disposed in a lower part of the back surface of the solar cell module 50.

The junction box 170, being connected to the inverter 1200 by the cable 211, provides DC power to the inverter 1200.

The inverter 1200 can be disposed close to the junction box 170 on the rear substrate 160 of the solar cell module 50 and by incorporating the micro-inverter 250, converts DC power supplied through the junction box 170 to AC power.

Also, the inverter 1200 comprises fastening holes and as fastening means 360 such as screws are combined with the fastening holes, the inverter 1200 can be fixed on the rear substrate 160. The fastening holes can be formed on an upper surface of the inverter 1200; different from the figure, the fastening holes can be formed on a side surface and the inverter 1200 can be fixed on the rear substrate 160. However, a structure for fastening the inverter 1200 on the rear substrate 160 is not limited to the above but various forms of fastening structure can be used. For example, guiding grooves (not shown) can be formed on the rear substrate 160 through which the inverter 1200 is slid to be fastened to the rear substrate 160.

Meanwhile, the inverter 1200 generates high heat from the micro-inverter 250 at the time of operation and the heat generated can reduce efficiency of a particular solar cell 130 arranged at the position where the inverter 1200 is attached.

To prevent generation of high heat, the frame 1300 can comprise a cover unit 350 formed as a part of the leg unit 320 is extended to cover the inverter 1200. The cover unit 350 can be formed by metallic substances with excellent thermal conductivity such as Au, Ag, Cu, Al, W, and so on. The cover unit 350 can be formed as a single body together with the leg unit 320 or can be fastened to the leg unit 320 after being manufactured separately.

As described above, if the cover unit 350 formed by a material with excellent thermal conductivity makes contact to an upper surface of the inverter 1200, heat produced at the inverter 1200 is dispersed to the outside through the cover unit 250 and thus efficiency of a particular solar cell 130 in which the inverter 1200 is disposed can be prevented from being degraded. Meanwhile, it is preferred that the size of the cover unit 350 is larger than that of the inverter 1200. At this time, the inverter 1200 can be positioned in the middle of the cover unit 350 for efficient heat transfer.

FIG. 16 illustrates a cross-section as seen along B-B' of FIG. 14. With reference to FIG. 16(*a*), a heat conductive can be disposed between the inverter 1200 and the cover unit 350. The heat conductive layer 230 can be formed by applying a tape or a paste with excellent thermal conductivity. Once a heat conductive layer 230 is formed as described above, space between the inverter 1200 and the cover unit 350 is removed, achieving more effective heat transfer.

Also, a heat insulating layer 220 can be formed between the inverter 1200 and the solar cell module 50. Therefore, degradation of efficiency of a particular solar cell 130 where the inverter 1200 is disposed due to the heat produced at the inverter 1200 can be prevented more effectively.

Meanwhile, the heat insulating layer 220 can have the same height as that of a lower joint 314. Therefore, part of the inverter 1200 is disposed to adhere tightly to the frame 1300 on the lower joint 314, preventing penetration of foreign substances.

FIG. 16(*b*) illustrates that a heat radiation fin 355 can be formed on one outside surface. If the heat radiation fin 355 is formed on one outside surface of the cover unit 350, the area of the cover unit 350 making contact to the air is increased and cooling efficiency is a lot more improved.

Meanwhile, FIG. 15 illustrates a case where the cover unit 350 and the inverter 1200 have fastening holes corresponding to each other and are fastened to each other as fastening means 360 such as screws are combined to the fastening holes, which is not limited to the above.

Meanwhile, the junction box 170 too generates high heat from bypass diodes Da, Db, Dc at the time of operation. Therefore, though not shown in the figure, the cover unit 350 can be formed to cover the junction box 170 and can further comprise the heat conductive layer 230 and the heat insulating layer 220 described above.

Also, water blocking coating can be applied for the inside of the junction box 170 and the inverter 1200 to protect the internal circuit elements.

Figure 17:
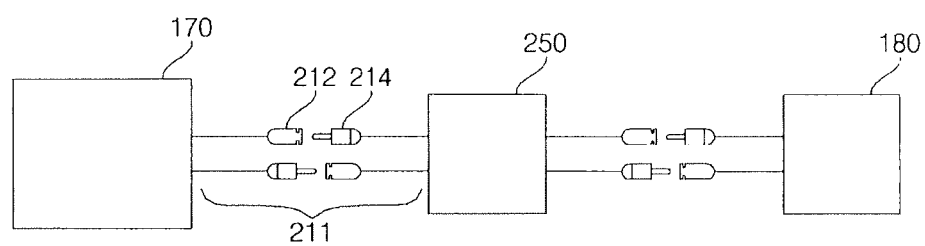
FIG. 17 illustrates how the junction box of the solar cell module, the inverter, and the interface unit of FIG. 12 are connected to one another.

FIG. 17 illustrates how the junction box of the solar cell module, the inverter, and the interface unit of FIG. 12 are connected to one another.

The junction box 170, the inverter 1200, and the interface unit 180 can be connected to one another through the cable 211. As shown in FIG. 17, fastening grooves 212 are formed at one end of the cable 211 while connecting terminals 214 are formed at the other end of the cable 211; thus, the fastening grooves 212 and the connecting terminals 214 are easily attached to or detached from each other, by which the junction box 170, the inverter 1200, and the interface unit 180 can be easily connected to one another.

Therefore, if abnormality occurs in the junction box 170, the inverter 1200, or the interface unit 180, only those showing the abnormality among the junction box 170, the inverter 1200, and the interface unit 180 can be easily replaced and installation of the photovoltaic module 100 can be made simple.

Figure 18:
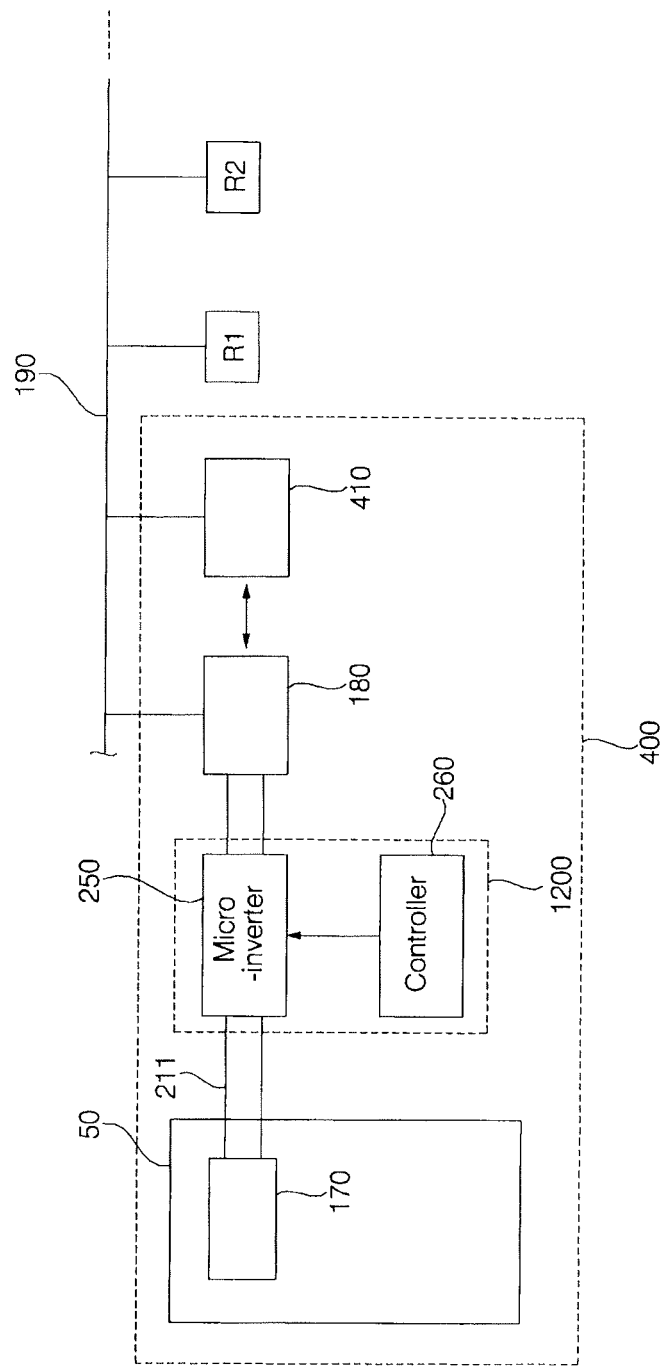
FIG. 18 illustrates a structure of a photovoltaic module according to another embodiment of the present invention.

FIG. 18 illustrates a structure of a photovoltaic module according to another embodiment of the present invention.

With reference to FIG. 18, a photovoltaic module 400 according to one embodiment of the present invention comprises a solar cell module 50; a junction box 170; an inverter 1200 comprising a micro-inverter 250 and a controller 260; and an interface unit 180 capable of connecting to power grid 190. The photovoltaic module 400 can further comprise a monitoring unit 410 which connects to the power grid 190 at a position separated from the interface unit 180.

The interface unit 180 is connected to the power grid 190 and accordingly, a photovoltaic module 100 which performs as a new power source is connected in parallel to an external power source supplying power to the power grid 190. Therefore, since part of power consumed in AC power devices is provided by the photovoltaic module 100, consumption of the external power flowing into home can be reduced.

Also, the interface unit 180 or the inverter 1200 can comprise a first communication module (not shown) for communication with the monitoring unit 410. The first communication module (not shown) transmits electrical power generated by the photovoltaic module 400 to the monitoring unit 410 based on the output current ic3 and the output voltage Vc3 detected at the output current detection unit (E of FIG. 7) and the output voltage detection unit (F of FIG. 7).

The monitoring unit 410 comprises a second communication module and a display. Therefore, the monitoring unit 410 receives the amount of electrical power generated by the photovoltaic module 100 transmitted by the first communication module disposed within the interface unit 180 or the inverter 1200 and displays the received amount of electrical power on the display. Also, the monitoring unit 410 detects external electrical power flowing into the power grid 190 and displays the detected external electrical power on the display, which is further transmitted to the first communication module (not shown) within the interface unit 180 or the inverter 1200.

Communication between the second communication module of the monitoring unit 410 and the first communication module disposed within the interface unit 180 or the junction box 170 can be carried out by short-range communication such as Wi-Fi, power line communication, etc. but is not limited to the above.

Meanwhile, based on the information about external electrical power received by the first communication module within the interface unit 180 or the junction box 170, the controller 260 controls the operation of the micro-inverter 250 such that AC power converted and supplied by the micro-inverter 250 matches to external electrical power provided to the power grid 190.

As described above, when included is the monitoring unit 410 connected to the power grid 190 at a position separated from the interface unit 180, the amount of electrical power can be displayed on the display, supporting real-time checking of the amount of electrical power.

Meanwhile, different from the figure, it should be understood as a natural consequence that the monitoring unit 410 can be formed as a single body together with the interface unit 180 connected to the power grid 190.

Figure 19:
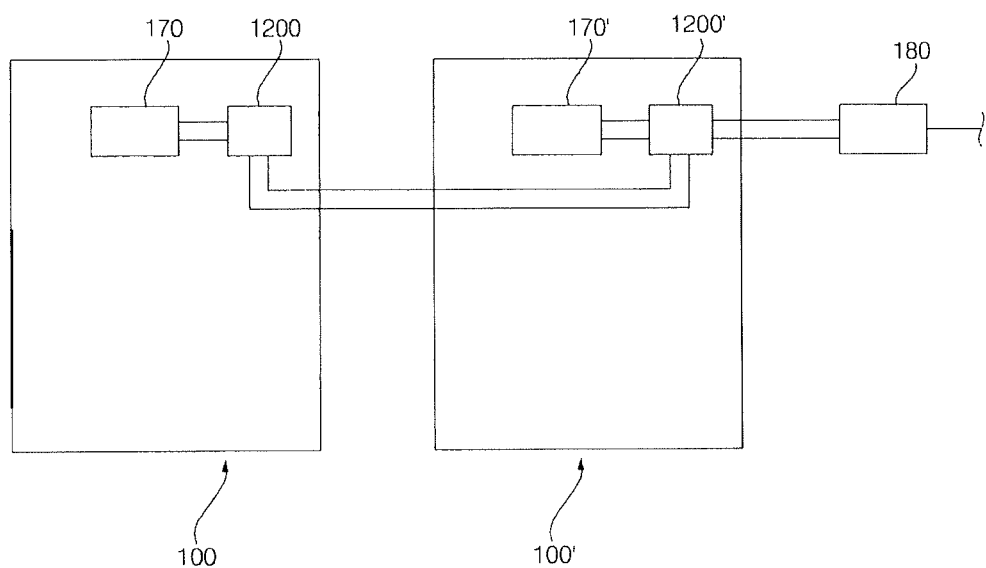
FIG. 19 illustrates a structure of a photovoltaic system according to another embodiment of the present invention.

FIG. 19 illustrates a structure of a photovoltaic system according to another embodiment of the present invention.

FIG. 19 illustrates a solar system where a first photovoltaic module 100 and a second photovoltaic module 100' are connected in parallel to each other but is not limited to the current embodiment, where three or more photovoltaic modules can be connected in parallel to one another.

With reference to the figure, the first photovoltaic module 100 comprises a first junction box 170 and a first inverter 1200 while the second photovoltaic module 100' comprises a second junction box 170' and a second inverter 1200'. At this time, the first inverter 1200 and the second inverter 1200' are connected in parallel to each other and the second inverter 1200' is connected to the interface unit 180.

According to the above, the first inverter 1200 converts DC power supplied from the first junction box 170 into AC power and delivers the AC power to the second inverter 1200' while the second inverter 1200' provides AC power delivered from the first inverter 1200 together with AC power converted from DC power supplied by the second junction box 170' to the external power grid through the interface unit 180.

Since the solar system as described above can provide much larger electrical power to the external power grid, consumption of the external electrical power can be further reduced.

The photovoltaic module according to the embodiments of the present disclosure is not limited in its application of the configurations and methods, but the entirety or a portion of the embodiments may be selectively combined to be configured into various modifications.

The control method of the photovoltaic module according to embodiments of the present invention can be implemented as codes that can be read by a processor in a processor-readable recording medium. The processor-readable recording medium includes various types of recording devices in which data read by a process is stored. The processor-readable recording medium may include a ROM, a RAM, a CD-ROM, a magnetic tape, a floppy disk, an optical data storage device, and the like. The processor-readable recording medium also includes implementations in the form of carrier waves or signals (e.g., transmission via the Internet). Also, codes which are distributed in computer system connected to a network and can be read by a processor in a distributed manner are stored and executed in the processor-readable recording medium.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A photovoltaic module, comprising:
   a solar cell module including a front substrate, a rear substrate, and a plurality of solar cells between the front substrate and a rear substrate, a first sealing member between the front substrate and the solar cells, and a second sealing member between the rear substrate and the solar cells;
   a metallic frame having a joint unit for supporting the solar cell module and a leg unit extended from the joint unit;
   a junction box attached on the rear substrate of a back side of the solar cell module, and connected to a conductive line, which is electrically connected to the plurality of solar cells;
   a bypass diode unit in the junction box, and including a plurality of bypass diodes for preventing reversal of current of DC power generated at the solar cells;
   an inverter unit located close to the junction box on the rear substrate of the solar cell module and fixed on a corner area of the frame by combining with the leg unit;
   a cable for providing the DC power from the junction box to the inverter;
   a converter in the inverter unit to convert a level of the DC power;
   an micro inverter in the inverter unit to convert the DC power into AC power;
   an output current detection unit to detect an output current of an output terminal of the micro-inverter;
   an output voltage detection unit to detect an output voltage of the output terminal of the micro-inverter;
   a controller in the inverter unit to control the micro-inverter's operation;
   a first communication module in the inverter unit to transmit information regarding the AC power converted from the micro inverter to a monitoring unit and to receive a data from the monitoring unit; and
   an interface unit connected to the micro-inverter to transmit the AC power to a monitoring unit,
   wherein the interface unit is connected to the inverter unit for providing the AC power to an external power grid.

2. The photovoltaic module of claim 1, wherein the monitoring unit comprises a display, which displays the information regarding AC power transmitted from the first communication module.

3. The photovoltaic module of claim 2, wherein the first communication module transmits an amount of electrical power generated at the photovoltaic module to the second communication module and the display displays an amount of electrical power received by the second communication module.

4. The photovoltaic module of claim 1, wherein a heat releasing member is disposed between the rear substrate and the junction box.

5. The photovoltaic module of claim 1, further comprising:
   a frame being fastened to the solar cell module,
   wherein the frame comprises:
   an upper joint;
   a lower joint; and
   an arm-shaped joint comprising a connecting joint connecting the two joints and a leg unit being extended from the connecting joint and forming an L shaped cross-section;
   wherein the frame is combined with the periphery of the solar cell module and supporting the solar cell module.

6. The photovoltaic module of claim 5, wherein the frame further comprises a cover unit being formed as part of the leg unit and extended to cover the micro-inverter.

7. The photovoltaic module of claim 6, wherein a heat insulating layer is between the cover unit and the micro-inverter.

8. The photovoltaic module of claim 6, wherein a heat insulating layer is between the micro-inverter and the rear substrate.

9. The photovoltaic module of claim 6, wherein a heat radiation fin is formed on one outside surface of the cover unit.

10. The photovoltaic module of claim 1, wherein the interface unit is connected to the power grid by bring plugged into an arbitrary one among multiple outlets connected to the power grid.

11. The photovoltaic module of claim 1, wherein if voltage of an external power source flowing into the power grid increases instantaneously, the controller controls operation of the micro-inverter in such a way to increase the turn-on duty of a switching element within the micro-inverter so that output level of current and voltage of the micro-inverter are increased immediately.

12. The photovoltaic module of claim 1, further comprising a converter configured to level-convert the DC power generated by the solar cell module and to output the level-converted DC power to the micro-inverter, wherein the converter includes a flyback converter.

13. The photovoltaic module of claim 1, further comprising:
   a capacitor unit to store DC voltage from the plurality of the solar cells.

14. The photovoltaic module of claim 1, wherein the frame further comprises a leg unit extended from the joint unit and a cover unit connected to the leg unit.

15. The photovoltaic module of claim 14, wherein the cover unit is separately formed from the leg unit and is combined with the leg unit.

16. The photovoltaic module of claim 14, wherein the inverter unit and the cover unit include respective fastening holes and screws combined with the respective fastening holes.

17. The photovoltaic module of claim 14, wherein the cover unit includes a metal from the group consisting of Au, Ag, Cu, Al, and W.

18. The photovoltaic module of claim 1, wherein the first communication module performs wireless communication or power line communication with the monitoring unit module.

19. The photovoltaic module of claim 1, wherein a heat releasing member is between the rear substrate and the inverter unit.

20. The photovoltaic module of claim 1, wherein the interface unit connecting the micro-inverter to the power grid is in from one of an outlet, an inlet, and a plug.

21. The photovoltaic module of claim 1, wherein the solar cell module includes a plurality of solar cell strings formed with some of a plurality of solar cells, a plurality of bus ribbons connecting the adjacent solar cell strings, and a plurality of conductive lines electrically connecting the solar cell strings and the plurality of bypass diodes, wherein the plurality of conductive lines are connected with the plurality of bypass diodes and are extended to a rear surface of the solar cell module through corresponding openings penetrating a rear substrate of the solar cell module, wherein one of the plurality of conductive lines connects the solar cell string and one of the plurality of bypass diodes, and wherein another of the plurality of conductive lines connects one of the plurality of bus ribbons and one of the plurality of bypass diodes.

22. The photovoltaic module of claim 1, wherein the monitoring unit includes a second communication module and detects external electrical power, and the second communication module transmits the detected external electrical power to the first communication module.

23. The photovoltaic module of claim 1, wherein the controller controls the micro-inverter based on the detected output current and the detected output voltage, wherein the controller controls operation of the micro-inverter based on the data received by the first communication module.

24. A photovoltaic module, comprising:

a solar cell module including a front substrate, a rear substrate, and a plurality of solar cells between the front substrate and the rear substrate, a first sealing member between the front substrate and the solar cells, and a second sealing member between the rear substrate and the solar cells;

a metallic frame having a joint unit for supporting the solar cell module;

a junction box attached on the rear substrate at a back side of the solar cell module, and connected to a conductive line, which is electrically connected to the plurality of solar cells;

a bypass diode unit in the junction box and including a plurality of bypass diodes for preventing reversal of current of DC power generated at the solar cells;

an inverter unit located close to the junction box on the rear substrate of the solar cell module and fixed on a area of the frame; and an interface unit connected to the inverter unit for providing AC power to an external power grid;

wherein the inverter unit comprises:

a converter to convert a level of the DC power;

a micro inverter to convert the DC power into AC power;

an output current detection unit to detect an output current of an output terminal of the micro-inverter;

an output voltage detection unit to detect an output voltage of the output terminal of the micro-inverter;

a controller to control the micro-inverter's operation; and a first communication module to transmit information regarding the AC power to a monitoring unit and to receive data from the monitoring unit;

wherein the controller operation of the micro-inverter is based on the data received by the first communication module from the monitoring unit, wherein the inverter unit is in the junction box.

* * * * *